(12) United States Patent
Lei et al.

(10) Patent No.: US 9,449,872 B1
(45) Date of Patent: Sep. 20, 2016

(54) METHOD FOR FORMING COBALT BARRIER LAYER AND METAL INTERCONNECTION PROCESS

(71) Applicant: Shanghai Huali Microelectronics Corporation

(72) Inventors: Tong Lei, Shanghai (CN); Jingxun Fang, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 14/753,311

(22) Filed: Jun. 29, 2015

(30) Foreign Application Priority Data

Apr. 13, 2015 (CN) .......................... 2015 1 0173198

(51) Int. Cl.
*H01L 21/44* (2006.01)
*H01L 21/768* (2006.01)
*H01L 21/285* (2006.01)
*H01L 21/02* (2006.01)

(52) U.S. Cl.
CPC ... *H01L 21/76829* (2013.01); *H01L 21/02274* (2013.01); *H01L 21/28562* (2013.01); *H01L 21/76843* (2013.01); *H01L 21/76865* (2013.01)

(58) Field of Classification Search
CPC .................. H01L 21/76829; H01L 21/02274; H01L 21/28562; H01L 21/76843; H01L 21/76865
USPC .......................................................... 438/677
See application file for complete search history.

(56) References Cited

U.S. PATENT DOCUMENTS

| 7,521,358 | B2* | 4/2009 | Bright | H01L 21/76805 257/E21.495 |
| 7,605,082 | B1* | 10/2009 | Reid | C23C 18/1607 257/E21.076 |
| 2004/0266184 | A1* | 12/2004 | RamachandraRao | H01L 21/76801 438/689 |
| 2005/0287826 | A1* | 12/2005 | Abell | C23C 16/402 438/202 |
| 2009/0269507 | A1* | 10/2009 | Yu | H01L 21/02074 427/535 |
| 2010/0233886 | A1* | 9/2010 | Yang | C23C 16/30 438/786 |
| 2013/0181292 | A1* | 7/2013 | Sardesai | H01L 21/823425 257/368 |

OTHER PUBLICATIONS

Philippe de Rouffignac, "Sealing Porous Low-k Dielectrics with Silica", Electrochemical and Solid-State Letters, 7 ~12! G306-G308, Oct. 2004.*

* cited by examiner

*Primary Examiner* — Armando Rodriguez
*Assistant Examiner* — Vu A Vu

(57) ABSTRACT

The present invention provides a method for forming a cobalt barrier layer and a metal interconnection process. The method is performed on a surface of a semiconductor device substrate on which metal interconnection lines and an inter-line dielectric layer are formed, and comprises: depositing a dielectric material film on a surface of the inter-line dielectric layer by atomic layer deposition, to densify the surface of the inter-line dielectric layer; removing the deposited dielectric material film, to expose the metal interconnection lines and the densified surface of the inter-line dielectric layer, selectively depositing cobalt on surfaces of the metal interconnection lines to form a cobalt barrier layer. In the present invention, deposition selectivity of cobalt on surfaces of the metal interconnection lines and the inter-line dielectric layer is improved, thus reducing leakage current between metal interconnection lines and improving yield and reliability of the product.

14 Claims, 2 Drawing Sheets

METHOD FOR FORMING COBALT BARRIER LAYER AND METAL INTERCONNECTION PROCESS

CROSS-REFERENCE TO RELATED APPLICATION

This application claims the priority benefit of China patent application serial No. 201510173198.8, filed Apr. 13, 2015. The entirety of each of the above-mentioned patent applications is hereby incorporated by reference herein and made a part of this specification.

FIELD OF THE INVENTION

The present invention relates to the field of semiconductor, and particularly to a method for forming a cobalt barrier layer and a metal interconnection process.

BACKGROUND OF THE INVENTION

With the development of fabricating process for CMOS integrated circuits and the reduction in critical dimension, novel materials and processes have been applied to device fabricating processes improve the performance of devices. In a back end process of integrated circuits, Copper (Cu) lines are used to replace Aluminum (Al) lines, and the interconnection resistance is greatly reduced. At the same time, the use of a porous low-k dielectric material can realize a dielectric constant of 2.5 or less. These techniques can effectively reduce RC delay in integrated circuits.

Since Cu is prone to diffuse, a Cu diffusion barrier layer is deposited after a chemical mechanical polishing of a back end Cu layer, and then a low-k dielectric material is deposited, so as to avoid the Cu diffusion into the low-k dielectric material. In technology nodes of 28 nm or larger, this Cu diffusion barrier layer is usually formed by a thin nitrogen-doped silicon carbide (NDC, k~5.3) film. In technology nodes of 28 nm or less, a diffusion barrier layer of cobalt film is introduced which is formed by CVD. The diffusion barrier layer of cobalt can not only block the diffusion of Cu, but also prevent the moisture in air from penetrating the Cu layer during fabrication. The introduction of the cobalt film indicates that the thickness of the nitrogen-doped silicon carbide (NDC) film is reduced, which facilitates reducing the overall effective k value. Besides, cobalt has excellent adhesion ability with respect to Cu, and the reliability of products can be significantly improved.

However, a more amount of cobalt deposited on the dielectric layer means a larger leakage current of between Cu interconnection lines. Thus, it is urgent to explore a method for depositing cobalt, in which the amount of cobalt deposited on a porous dielectric layer is as small as possible, namely, deposition selectivity is as much as possible.

BRIEF SUMMARY OF THE DISCLOSURE

To overcome the problems as mentioned above, it is an object of the present invention to improve deposition selectivity of cobalt on surfaces of metal interconnection lines and a surface of inter-line dielectric layer, thus reducing the amount of the cobalt deposited on the dielectric layer.

To realize the above object, the present invention provides a method for forming a cobalt barrier layer, which is performed on a surface of a semiconductor device substrate on which metal interconnection lines and an inter-line dielectric layer are formed, and which comprises the following steps:

Step 01: depositing a dielectric material film on a surface of the inter-line dielectric layer by atomic layer deposition, to densify the surface of the inter-line dielectric layer.

Step 02: removing the deposited dielectric material film, to expose the metal interconnection lines and the densified surface of the inter-line dielectric layer;

Step 03: selectively depositing cobalt on surfaces of the metal interconnection lines to form a cobalt barrier layer.

Preferably, after step 02 and before step 03, the method comprises: treating the surfaces of the metal interconnection lines and the surface of the inter-line dielectric layer with reducing plasma treatment.

Preferably, the inter-line dielectric layer is formed by a porous low-k dielectric material.

Preferably, in step 01, the dielectric material film penetrates the porous low-k dielectric material, and a surface of the porous low-k dielectric material is densified.

Preferably, in step 01, the atomic layer deposition is a plasma enhanced atomic layer deposition.

Preferably, the temperature of the substrate is decreased, the radio frequency energy is decreased, and a reactant gas of low oxidability is adopted during the atomic layer deposition.

Preferably, the carbon dioxide is adopted as the reactant gas during the atomic layer deposition.

Preferably, the dielectric material film is silicon oxide film, the thickness of the silicon oxide is 10~50 Å. Preferably, in step 03, the cobalt barrier layer is deposited by chemical vapor deposition, the thickness of cobalt barrier layer is 20~100 Å. To realize the above object, the present invention further provides a metal interconnection process, which comprises:

forming front end metal interconnection lines and an inter-line dielectric layer;

forming a cobalt barrier layer on surfaces of the front end metal interconnection lines by the method of claim 1;

forming a diffusion barrier layer on surfaces of the cobalt barrier layer and the inter-line dielectric layer;

forming back end metal interconnection lines on the diffusion barrier layer.

The method for forming a cobalt barrier layer and the metal interconnection process of the present invention are based on the principle that cobalt shows a relatively high deposition selectivity with respect to a surface of a dense dielectric material. In view of this, a dielectric material film is deposited on the surface of the inter-line dielectric layer by atomic layer deposition, so that the surface of the inter-line dielectric layer is densified. As a result, deposition selectivity of cobalt on surfaces of the metal interconnection lines and the surface of the inter-line dielectric layer is improved, leakage current between metal interconnection lines is reduced, and yield and reliability of the product are improved.

DETAILED DESCRIPTION OF THE EMBODIMENTS

The present invention will be described in further details hereinafter by referring to the accompanying drawings, so as to provide a better understanding of the present invention. However, the present invention is not limited to these embodiments. All equivalent modifications and substitutions without departing from the spirit and scope of the present invention should be covered by the present invention.

In a method for forming a cobalt barrier layer of the present invention, a dielectric material film is deposited on a surface of an inter-line dielectric layer by atomic layer deposition. As a result, the surface of the inter-line dielectric layer is densified, so that the cobalt is selectively deposited on surfaces of metal interconnection lines, and hardly deposited on the surface of the inter-line dielectric layer. The underlying principle follows. During atomic layer deposition, the dielectric material will penetrate a skin layer of the inter-line dielectric layer so that the skin layer is densified. In addition, the amount or thickness of the deposited cobalt is different for various substrate surfaces, i.e., more cobalt is deposited on a dense substrate surface, while less cobalt is deposited on a loose or porous substrate surface. In other words, the cobalt is prone to be selectively deposited on a dense substrate surface. The present invention intends to inhibit deposition of cobalt on the surface of the inter-line dielectric layer, and promote selective deposition of cobalt on surfaces of metal interconnection lines. Thus, in the present invention, a dielectric material film is formed on the surface of the inter-line dielectric layer to improve a density of the surface of the inter-line dielectric layer, so as to improve deposition selectivity of cobalt on the surfaces of metal interconnection lines and the surface of inter-line dielectric layer.

The method for forming a cobalt barrier layer of the present invention will be described hereinafter with reference to FIG. 1-4 and specific embodiments. It is noted that the accompanying drawings are drawn in a simplified manner and not to scale, and that the accompanying drawings are only used to illustrate embodiments in a convenient and clear manner.

Figure 1:
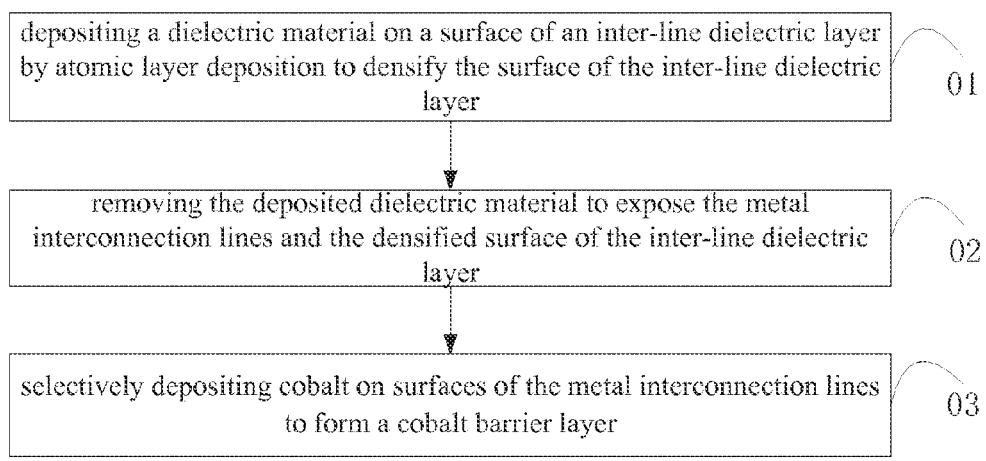
FIG. 1 is a flow chart for illustrating a method for forming a cobalt barrier layer in a preferred embodiment of the present invention.

Referring to FIG. 1, in an embodiment of the present invention, forming a cobalt barrier layer belongs to a back end metal interconnection process, and the method for forming a cobalt barrier layer is performed on a semiconductor device substrate on which metal interconnection lines and an inter-line dielectric layer are formed, and comprises the following steps.

Figure 2:
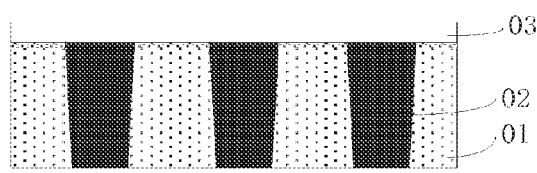
FIGS. 2, 3, 4 are schematic views for illustrating each step in a method for forming a cobalt barrier layer in a preferred embodiment of the present invention.

Step 01: referring to FIG. 2, a dielectric material film 03 is deposit on a surface of an inter-line dielectric layer 01 by atomic layer deposition, so that the surface of the inter-line dielectric layer 01 is densified.

In particular, in this embodiment, the dielectric material film 03 is deposited by atomic layer deposition after chemical mechanical polishing process of metal interconnection lines. The dielectric material film 03 is also deposited on surfaces of metal interconnection lines 02. Due to limits in temperature during back end metal interconnection process, a plasma enhanced atomic layer deposition is adopted, and the deposition temperature is 50-400° C. The deposition comprises but is not limited to a cyclic process of: adsorption of precursors on the surface of the inter-line dielectric layer, purging the deposited dielectric material with an inert gas, and plasma cleaning the deposited dielectric material. In order to reduce damage to the inter-line dielectric layer due to plasma, during the atomic layer deposition, a temperature of the substrate can be reduced, e.g., a substrate temperature of 50° C.; the radio frequency energy can be decreased; and a reactant gas of low oxidability, e.g., carbon dioxide, can be adopted. The material of the deposited dielectric film can be silicon oxide, and a thickness of the silicon oxide film is 10~50 Å. In this process, since the precursors may enter voids in the surface of the inter-line dielectric layer, and the dielectric material grows in these voids, so that a skin layer of the inter-line dielectric layer is densified. The densified portion has an increased k value. However, since the densified skin layer is very thin, the overall k value of the inter-line dielectric layer will not increase significantly. Of course, other dielectric materials can be deposited by atomic layer deposition, and all those dielectric materials which will not lead to significant increase in k value of the inter-line dielectric layer can be adopted in the present invention.

In this embodiment, the material of the inter-line dielectric layer 01 is a porous low-k dielectric. The dielectric material film 03 penetrates the porous low-k dielectric material, so that the porous low-k dielectric material surface is densified.

Figure 3:
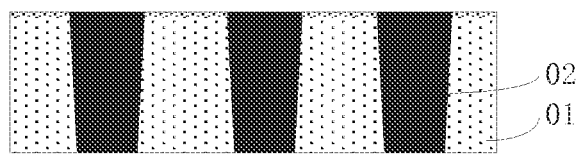

Step 02: referring to FIG. 3, the deposited dielectric material 03 is removed, the densified surface of the inter-line dielectric layer 01 and the metal interconnection lines 02 are exposed.

In particular, the method for removing the dielectric material comprises but is not limited to plasma dry etching process. When the deposited dielectric material film is removed, the densified surface of the inter-line dielectric layer is retained. In this embodiment, the deposited dielectric material film is silicon oxide film. In this case, a silicon-cobalt-nickel process can be used to etch and remove the silicon oxide thin film. Reference can be made to the existing process for specific etching steps of the silicon-cobalt-nickel process, which are not repeated here for simplicity. Of course, other etching methods can also be applied in other embodiments of the present invention.

In this embodiment, after step 02 and before step 03, the method comprises: treating the surfaces of the metal interconnection lines and the surface of the inter-line dielectric layer by reducing plasma. The reducing plasma can be H plasma (for example, H2 plasma), so that oxidized metal on the surfaces of the metal interconnection lines can be reduced. In addition, the inter-line dielectric layer can be repaired to a certain extent, so that k value of the inter-line dielectric layer is decreased. For example, Cu metal interconnection lines may be oxidized into copper oxide during the preceding deposition or removing processes, and treating surfaces of Cu metal interconnection lines with H plasma can reduce copper oxide into Cu metal. Besides, by treating porous the surface of the low-k dielectric material with H plasma, damage to the porous low-k dielectric material during the above-mentioned deposition or removing processes can be repaired, so that k value is further reduced.

Figure 4:
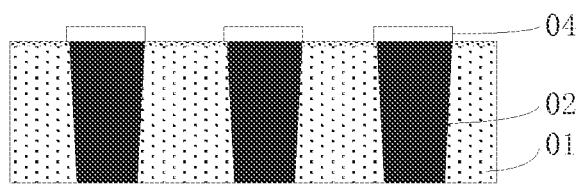

Step 03: referring to FIG. 4, the cobalt is selectively deposited on the surfaces of the metal interconnection line 02, so that a cobalt barrier layer 04 is formed.

In particular, the cobalt barrier layer is deposited by chemical vapor deposition. Since the surface of the inter-line dielectric layer is densified, the deposition of the cobalt will exhibit excellent selectivity. As a result, the cobalt is selectively deposited on the surfaces of the metal interconnection lines, while is hardly deposited on the surface of the inter-line dielectric layer, thus improving deposition selectivity of the cobalt. The cobalt barrier layer can have a thickness of 20~100 Å.

The present invention further provides a metal interconnection process, which comprises the following steps.

Firstly, front end metal interconnection lines and an inter-line dielectric layer are formed. Conventional processes can be used in this case, which are not repeated here for simplicity.

Then, a cobalt barrier layer is formed on the surfaces of the front end metal interconnection lines by the above-mentioned method for forming a cobalt barrier layer.

Then, a diffusion barrier layer is formed on surfaces of the cobalt barrier layer and of the inter-line dielectric layer. The diffusion barrier layer can be made from nitrogen-doped silicon carbide, and can have a thickness of 50~200 Å. Conventional processes can be used in this case, which are not repeated here for simplicity.

Finally, back end metal interconnection lines are formed on the diffusion barrier layer.

In an embodiment of the present invention, the method for forming metal interconnection lines comprises the following steps.

Step 201: a first barrier layer and a low-k dielectric material are deposited in sequence on the semiconductor device substrate.

In particular, the semiconductor device substrate comprises but is not limited to substrates which have been subject to front end interconnection processes. The semiconductor device substrate comprises a porous low-k dielectric material formed in a front end interconnection process, a first trench, and a filling metal in the first trench. A diffusion barrier layer of e.g. Ta/TaN is formed on an inner wall of the first trench, and the filling metal is formed on a surface of the diffusion barrier layer. In step 201, the low-k dielectric material is formed in a PECVD reactor chamber, and the reactants comprise methyldiethoxysilane (mDEOS) and α-terpinene (ATRP). The ATRP acts as a pore-foaming agent, the reaction temperature is 200~400° C., and the deposited low-k dielectric material has a thickness of 1000~5000 Å. It is noted that, the substrate of the semiconductor device in the present invention can be any semiconductor substrate, and all those substrates of the semiconductor device which are subject to interconnection processes of porous low-k dielectric material can be applied in the present invention.

Step 202: the deposited low-k dielectric material is subject to a first ultraviolet curing process.

In particular, the low-k dielectric material is formed by the first ultraviolet curing process. In the first ultraviolet curing process, a curing temperature is 300~400° C., and a curing time is determined on basis of the thickness of the low-k dielectric material and is for example 100-1000 seconds. In the present invention, a high porosity, a low k value, and a high mechanical strength of the low-k dielectric material are realized by means of the first ultraviolet curing process. These effects cannot be obtained if the duration of the first ultraviolet curing process is too short. Thus, in some embodiments of the present invention, the curing time of the first ultraviolet curing process is larger than that of the second ultraviolet curing process. In this embodiment, the curing time of the first ultraviolet curing process makes up 80%~95% of the total curing time of the first and second ultraviolet curing processes. In this way, in this embodiment, the low-k dielectric material will still shrink in the first ultraviolet curing process. However, the low-k dielectric material will shrink in the first ultraviolet curing process to an extent less than the extent to which the low-k dielectric material will shrink in a single curing process. The first ultraviolet curing process can comprise a plurality of ultraviolet curing processes in which, for example, different curing temperatures are adopted.

Step 203: a second trench is formed in the low-k dielectric material by photolithography and etching processes, and the first barrier layer at a bottom of the second trench is etched away to expose the filling metal in the first trench.

In particular, firstly, the second trench is formed by photolithography and etching; then a diffusion barrier layer of e.g. Ta/TaN is deposited on an inner wall and a bottom of the formed second trench; then, a portion of the first barrier layer at the bottom of the second trench is etched away. Conventional processes can be used in this case, which are not repeated here for simplicity.

Step 204: a metal is filled in the second trench, and the filled metal is subject to chemical mechanical polishing up to the surface of the low-k dielectric material.

In particular, the copper can be deposited in the second trench by copper plating process. In this step, the low-k dielectric material is removed partially by chemical mechanical polishing. In this embodiment, after chemical mechanical polishing, the low-k dielectric material has a thickness of 1200~1800 Å. Here, the first trench and the filling metal therein as well as the second trench and the filling metal therein constitute interconnection through holes.

Step 205: the low-k dielectric material is subject to a second ultraviolet curing process to form a porous low-k dielectric material.

In particular, in the second ultraviolet curing process, the curing temperature is 300~400° C. In the second ultraviolet curing process, the pore-foaming agent in the low-k dielectric material is discharged completely. The interconnection through holes functions to support the low-k dielectric material to prevent it from shrinking, while precipitation and crosslinking of the pore-foaming agent will still proceed. This means that the low-k dielectric material will have an even higher porosity and lower k value. In this embodiment, the second ultraviolet curing process has a duration which makes up 5~20% of the total duration of the first and second ultraviolet curing processes. The second ultraviolet curing process can comprise a plurality of ultraviolet curing processes in which, for example, different curing temperatures can be adopted.

Step 206: a second barrier layer is deposited on the surface of the porous low-k dielectric material and the surface of the filled metal.

In particular, the material of the second barrier layer can be, but is not limited to, nitrogen-doped silicon carbide.

To sum up, the method for forming a cobalt barrier layer and the metal interconnection process of the present invention are based on the principle that the cobalt shows a relatively high deposition selectivity with respect to a surface of a dense dielectric material. In view of this, a dielectric material film is deposited on the surface of the inter-line dielectric layer by atomic layer deposition, so that the surface of the inter-line dielectric layer is densified. As a result, the deposition selectivity of the cobalt on surfaces of the metal interconnection lines and the surface of the inter-line dielectric layer is improved, the leakage current between metal interconnection lines is reduced, and the yield and reliability of the product are improved.

While the invention has been described in connection with preferred embodiments, it will be understood that modifications thereof within the principles outlined above will be evident to those skilled in the art, and thus the invention is not limited to the preferred embodiments but is intended to encompass such modifications. The invention resides in each and every novel characteristic feature and each and every combination of characteristic features. Reference numerals in the claims do not limit their protective scope.

The invention claimed is:

1. A method for forming a cobalt barrier layer, which is performed on a surface of a semiconductor device substrate on which metal interconnection lines and an inter-line dielectric layer are formed, comprising the following steps in order:

Step 01: depositing a dielectric material film on a surface of the inter-line dielectric layer and surfaces of the metal interconnection lines by atomic layer deposition, to densify the surface of the inter-line dielectric layer and increase a deposition selectivity of cobalt between the surfaces of the metal interconnection lines and the densified surface of the inter-line dielectric layer;

Step 02: removing the deposited dielectric material film, to expose the metal interconnection lines and the densified surface of the inter-line dielectric layer; then treating the surfaces of the metal interconnection lines and the surface of the inter-line dielectric layer with reducing plasma treatment;

Step 03: selectively depositing cobalt on the surfaces of the metal interconnection lines to form a cobalt barrier layer.

2. The method for forming a cobalt barrier layer of claim 1, wherein the inter-line dielectric layer is formed by a porous low-k dielectric material.

3. The method for forming a cobalt barrier layer of claim 2, wherein, in step 01, the dielectric material film penetrates the porous low-k dielectric material, and a surface of the porous low-k dielectric material is densified.

4. The method for forming a cobalt barrier layer of claim 1, wherein, in step 01, the atomic layer deposition is plasma enhanced atomic layer deposition.

5. The method for forming a cobalt barrier layer of claim 4, wherein the temperature range of the substrate in the process of the plasma enhanced atomic layer deposition is 50 to 400'C.

6. The method for forming a cobalt barrier layer of claim 5, wherein, the temperature of the substrate is decreased, radio frequency energy is decreased, and a reactant gas of low oxidability is adopted during the atomic layer deposition.

7. The method for forming a cobalt barrier layer of claim 6, wherein the reactant gas is carbon dioxide.

8. The method for forming a cobalt barrier layer of claim 6, wherein the temperature of the substrate is 50'C.

9. The method for forming a cobalt barrier layer of claim 4, wherein, the reactant gas during the atomic layer deposition is carbon dioxide.

10. The method for forming a cobalt barrier layer of claim 1, wherein, the dielectric material film is a silicon oxide film.

11. The method for forming a cobalt barrier layer of claim 10, wherein, the thickness of the silicon oxide is 10 to 50 Angstroms.

12. The method for forming a cobalt barrier layer of claim 1, wherein, in step 03, the cobalt barrier layer is deposited by chemical vapor deposition.

13. The method for forming a cobalt barrier layer of claim 1, wherein the thickness of the cobalt barrier layer is 20 to 100 Angstroms.

14. A metal interconnection process, comprising the following steps in order:

forming front end metal interconnection lines and an inter-line dielectric layer;

forming a cobalt barrier layer on surfaces of the front end metal interconnection lines by the method of claim 1;

forming a diffusion barrier layer on surfaces of the cobalt barrier layer and the inter-line dielectric layer;

forming back end metal interconnection lines on the diffusion barrier layer.

* * * * *